United States Patent
de Jonge

(10) Patent No.: US 7,777,185 B2
(45) Date of Patent: Aug. 17, 2010

(54) METHOD AND APPARATUS FOR A HIGH-RESOLUTION THREE DIMENSIONAL CONFOCAL SCANNING TRANSMISSION ELECTRON MICROSCOPE

(75) Inventor: Niels de Jonge, Oak Ridge, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 376 days.

(21) Appl. No.: 11/860,760

(22) Filed: Sep. 25, 2007

(65) Prior Publication Data

US 2009/0078868 A1    Mar. 26, 2009

(51) Int. Cl.
*H01J 37/26* (2006.01)
*H01J 37/28* (2006.01)
*G01N 23/04* (2006.01)

(52) U.S. Cl. .................... 250/311; 250/307
(58) Field of Classification Search .................. 250/311, 250/307
See application file for complete search history.

(56) References Cited

U.S. PATENT DOCUMENTS

| | | | | |
|---|---|---|---|---|
| 3,013,467 | A * | 12/1961 | Minsky | 356/432 |
| 4,702,607 | A * | 10/1987 | Kinameri | 356/432 |
| 6,548,810 | B2 | 4/2003 | Zaluzec | |
| 6,552,340 | B1 * | 4/2003 | Krivanek et al. | 850/7 |
| 6,800,853 | B2 * | 10/2004 | Ohkura | 250/307 |

FOREIGN PATENT DOCUMENTS

JP    2008270056 A  * 11/2008

OTHER PUBLICATIONS

P. D. Nellist, et al., "Direct Sub-Angstrom Imaging of a Crystal Lattice", Science Magazine, Sep. 17, 2004, vol. 305.
K. Van Benthem, et al., "Three-Dimensional Imaging of Individual Hafnium Atoms Inside a Semiconductor Device", Applied Physics Letters, 2005, vol. 87, 034104-1.
M. Minsky, "Memoir on Inventing the Confocal Scanning Microscope", Scanning, 1988, vol. 10, pp. 128-138.
N. de Jonge, et al., "3-Dimensional Aberration Corrected Scanning Transmission Electron Microscopy for Biology", Nanotechnology in Biology and Medicine, ed. T. Vo-Kinh, 2007, pp. 13.1-13.27.

* cited by examiner

*Primary Examiner*—Jack I Berman
(74) *Attorney, Agent, or Firm*—Boyle Fredrickson, S.C.

(57) ABSTRACT

A confocal scanning transmission electron microscope which includes an electron illumination device providing an incident electron beam propagating in a direction defining a propagation axis, and a precision specimen scanning stage positioned along the propagation axis and movable in at least one direction transverse to the propagation axis. The precision specimen scanning stage is configured for positioning a specimen relative to the incident electron beam. A projector lens receives a transmitted electron beam transmitted through at least part of the specimen and focuses this transmitted beam onto an image plane, where the transmitted beam results from the specimen being illuminated by the incident electron beam. A detection system is placed approximately in the image plane.

22 Claims, 6 Drawing Sheets

METHOD AND APPARATUS FOR A HIGH-RESOLUTION THREE DIMENSIONAL CONFOCAL SCANNING TRANSMISSION ELECTRON MICROSCOPE

STATEMENT REGARDING FEDERALLY SPONSORED RESEARCH

This invention was made with assistance under Contract No. DE-AC05-00OR22725 with the U.S. Department of Energy. The Government has certain rights in this invention.

BACKGROUND OF THE INVENTION

The present invention relates to electron microscopy, and, more particularly, to a method and apparatus for a confocal scanning transmission electron microscope.

The imaging of samples with high resolution and in three dimensions is of critical importance for many fields, such as biology, materials science and semi-conductor development, among others. One of the major tools in modern biology research is the confocal laser microscope (M. Minsky, "Memoir on Inventing the Confocal Scanning Microscope", Scanning (USA) 10, 128-138, 1988). The principles and elements of operation include a laser beam focused by an objective lens on a sample at a certain focal plane. The back-scattered light, often from fluorescent markers, is separated from the laser beam by a beam splitter and focused on a pinhole aperture, producing a strong signal in the detector. The key to its depth sensitivity is that light generated not at the focal place is out-of-focus on the pinhole and, consequently, produces much less signal in the detector. In other words, the principal light rays for the focal plane are towards the pinhole aperture and those focused above and below the focal plane are excluded, demonstrating the principle of depth sensitivity of the microscope. Thus, there is a strong difference in light intensity on the detector between light originating from the focal plane and light not originating from the focal plane. The beam is scanned in x and y direction in the focal plane to obtain an image from one plane, then the focus is changed to a new plane and again an image is recorded. This process is repeated, thereby stepping through a series of z values, thus obtaining a three dimensional (3D) image. The image is often deconvoluted with the point spread function (equal to the 3D probe shape) to obtain a sharp 3D image.

The main disadvantage of confocal laser microscopy is that the resolution is not better than a few hundreds of nanometers (nm), due to the wavelength of light. To obtain 3D images with a better resolution several other techniques exist, for example, nuclear magnetic resonance (NMR) spectroscopy, X-ray crystallography, atomic force microscopy (AFM), and electron tomography. But all techniques have their disadvantages. NMR has limited applicability and requires large quantities of a sample in solution, X-ray crystallography requires high-quality crystals with many repeating units of the object of interest, AFM is a surface technique only, electron tomography has many practical difficulties due the required tilt series and has limited resolution.

A few years ago it was proposed to build a confocal electron microscope by N. J. Zaluzec (U.S. Pat. No. 6,548,810), which included an electron source, a scan unit, a lens, a specimen, a second lens, a second scan unit, a pinhole aperture and a detector. The main difference between the Zaluzec '810 invention and the laser confocal microscope is that the detection is not through the objective lens, but that a second lens is employed to project the beam on the pinhole aperture. The reason for this is that the amount of back-scattered electrons with exactly the same energy as the beam is extremely low and, therefore, it is not feasible to use the reversed optical path. The use of a second lens and a second scan unit introduces a major problem, since the scan operation has to be aligned and synchronized between two units with nanometer precision, which is practically almost impossible due to external mechanical vibrations, electromagnetic field, temperature fluctuations, and drift and hysteresis of the microscope.

A partial solution to this problem was found at Oak Ridge National Laboratory, avoiding the pinhole and using an aberration corrected (P. D. Nellist, et al., "Direct Sub-angstrom Imaging of a Crystal Lattice", Science 305, 1741, 2004) scanning transmission electron microscope (STEM). The use of an aberration corrected STEM provided a sufficiently large beam opening angle to provide depth sensitivity, thus optaining the electron optical variant of the wide field microscope. The depth sensitivity with aberration corrected STEM was demonstrated by locating hafnium atoms in a $Si/SiO_2/HfO_2$ advanced device structure with a vertical resolution of approximately 7 nm (K. van Benthem, et al., "Three-Dimensional Imaging of Individual Hafnium Atoms Inside a Semiconductor Device", Applied Physics Letters 87, 034104-1, 2005). Data on biological samples, i.e., conventional thin sections (osmium stained and epoxy embedded) of mammalian cells, showed a depth resolution of 50 nm (N. de Jonge, et al., "3-Dimensional Aberration Corrected Scanning Transmission Electron Microscopy for Biology", in "Nanotechnology in Biology and Medicine", ed. Vo-Dinh, T., 2007 (CRC Press), pp 13.1-13.27). The disadvantage of this method is that the image in one z-plane is mixed with a strong out-of-focus signal from the adjacent planes.

What is needed in the art is a method and an apparatus for a high-resolution three dimensional electron microscope.

SUMMARY OF THE INVENTION

The invention comprises a confocal STEM with a pinhole aperture, a precision specimen scanning stage, a control system and an operating procedure, to provide sub-nanometer 3D spatial information of a sample or specimen, by moving the stage instead of the electron beam.

The invention comprises, in one form thereof, a confocal scanning transmission electron microscope which includes an electron illumination device providing an incident electron beam propagating in a direction defining a propagation axis, and a precision specimen scanning stage positioned along the propagation axis and movable in a first direction and in a second direction defining a plane which is transverse to the propagation axis. The precision specimen scanning stage is configured for positioning a specimen relative to the incident electron beam. A projector lens receives a transmitted electron beam transmitted through at least part of the specimen and focuses this transmitted beam onto an image plane, where the transmitted beam results from the specimen being illuminated by the incident electron beam. A detection system including a beam limiting device is placed approximately in the image plane.

The invention comprises, in another form thereof, a method of generating a high resolution three dimensional image of a specimen using a confocal scanning transmission electron microscope, which includes the steps of: providing an electron illumination device having an incident electron beam propagating in a direction defining a propagation axis; positioning a precision specimen scanning stage along the propagation axis; positioning a specimen on the precision specimen scanning stage relative to the incident electron beam such that the incident electron beam is illuminating the specimen thereby producing a transmitted electron beam; imaging the transmitted electron beam with a projector lens onto a detection system being placed approximately in a focus of the transmitted beam; and scanning the specimen to a new position using the precision specimen scanning stage.

The invention comprises, in yet another form thereof, a method of configuring a confocal scanning transmission electron microscope, comprising the steps of: providing an electron source producing an incident electron beam propagating in a direction defining a propagation axis; controlling a beam blanker along the propagation axis on which the incident electron beam impinges; correcting at least one aberration in the incident electron beam; imaging the electron source onto a specimen space using an objective lens; inserting a precision scanning stage approximately in the specimen space; imaging the specimen space onto a detection system which includes a beam limiting device and a detector.

The invention comprises, in yet another form thereof, a confocal scanning transmission electron microscope which includes an electron illumination device providing an incident electron beam propagating in a direction defining a propagation axis, and a precision specimen scanning stage positioned along the propagation axis and movable in a first direction. The precision specimen scanning stage is configured for positioning a specimen relative to the incident electron beam. A projector lens receives a transmitted electron beam transmitted through at least part of the specimen and focuses this transmitted beam onto an image plane. The transmitted beam results from the specimen being illuminated by the incident electron beam. A detection system is placed approximately in the image plane, the detection system including a slit aperture oriented in a second direction substantially orthogonal with the first direction.

The invention comprises, in yet another form thereof, a method of generating a high resolution three dimensional image of a specimen using a confocal scanning transmission electron microscope, which includes the steps of: providing an electron illumination device having an incident electron beam propagating in a direction defining a propagation axis; positioning a precision specimen scanning stage along the propagation axis; positioning a specimen on the precision specimen scanning stage relative to the incident electron beam such that the incident electron beam is illuminating the specimen thereby producing a transmitted electron beam; imaging the transmitted electron beam with a projector lens onto a detection system being placed approximately in a focus of the transmitted beam, the detection system including an electron detector and a slit aperture; and scanning the specimen to a new position using the precision specimen scanning stage.

Advantages of at least one embodiment of the present invention are that it provides a new 3D technique with sub-nanometer resolution, single particle sensitivity and which is easy to use, and has a strong need and potential impact in both science and industry.

Another advantage of at least one embodiment of the present invention is that it provides 3D sub-nanometer spatial resolution due to the use of the combination of the electron beam and an aperture.

Yet another advantage of at least one embodiment of the present invention is that the technique is single particle sensitive (no need for crystals).

Yet another advantage of at least one embodiment of the present invention is that the apparatus is relatively easily built with existing components.

Yet other advantages of at least one embodiment of the present invention are that alignment of the electron beam is straightforward and there are no dynamically synchronized beam scans, which have been shown in the prior art to be practically almost impossible to implement.

Yet another advantage of at least one embodiment of the present invention is that there is also no need for tilt-series.

Yet another advantage of at least one embodiment of the present invention is that the technique is relatively easy to use.

Yet another advantage of at least one embodiment of the present invention is that the bandwidth and the required regulation of the optical elements can be made much slower with respect to a scanning system, thereby largely improving the stability of the system.

Yet another advantage of at least one embodiment of the present invention is that it can accommodate a variety of sizes of specimens through the use of the motors and piezo actuators on the precision specimen scanning stage.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE PREFERRED EMBODIMENT

Figure 1:
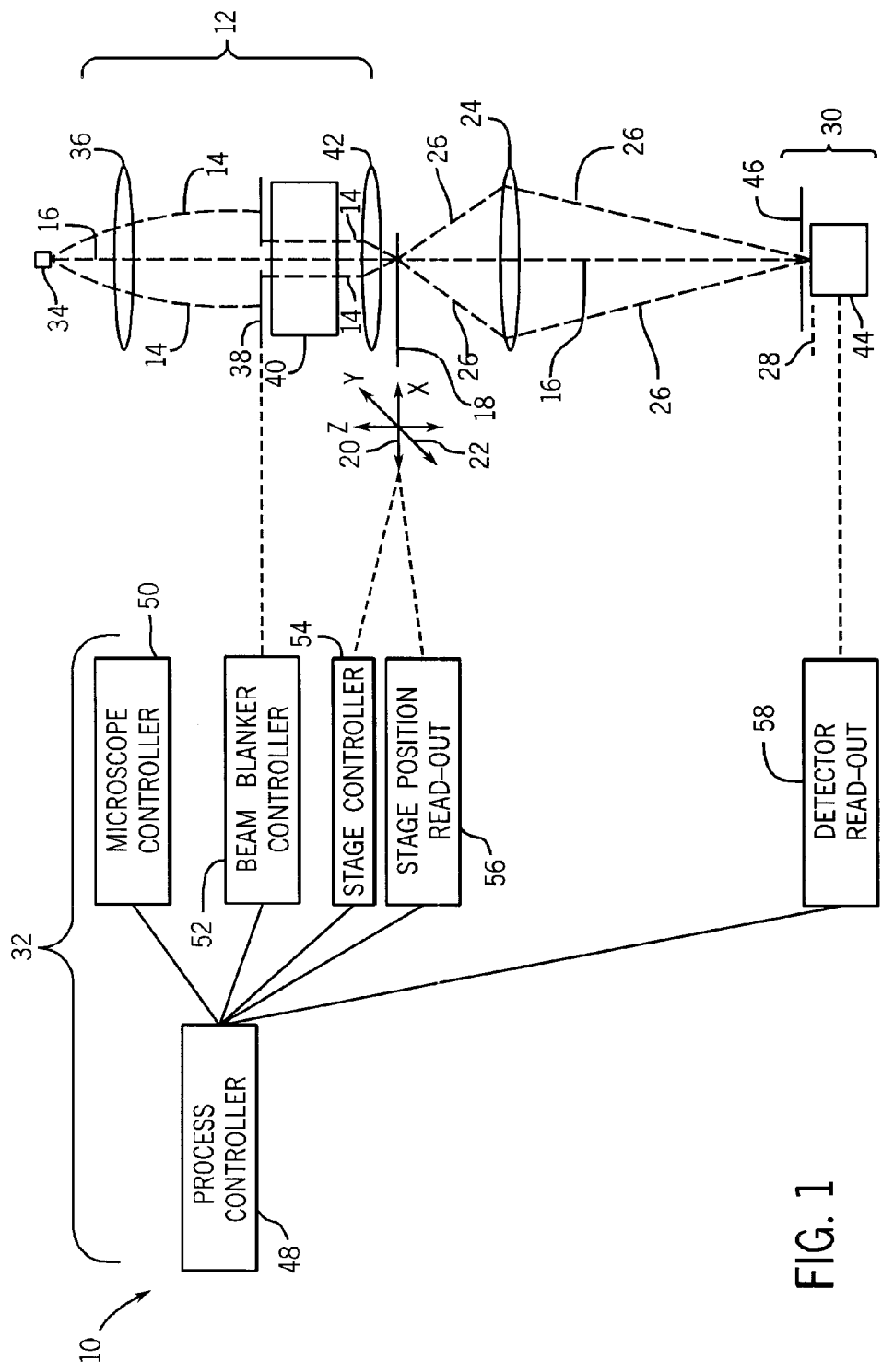
FIG. 1 is a schematic side view of an embodiment of a confocal scanning transmission electron microscope.

Referring now to drawings, and more particularly to FIG. 1, there is shown a confocal scanning transmission electron microscope 10 which includes an electron illumination device 12 providing an incident electron beam 14 propagating in a direction defining a propagation axis 16 (optical axis). A precision specimen scanning stage 18 is positioned along propagation axis 16 and movable in a first direction 20 and a second direction 22 along a plane defined by these two intersecting directions, and which plane is transverse to propagation axis 16; and movable in a third Z direction which is parallel to, or along, the propagation axis 16. First direction 20, second direction 22, and propagation axis 16 can define three orthogonal axes, although other configurations are possible. Alternatively, for example, the first direction can be a radial direction and the second direction can be an angular direction as in polar coordinates. Additionally, instead of three orthogonal translation directions as depicted in FIG. 1, the present invention can include any combination of angular tilting of the specimen and/or translation and/or rotation, where the tilting and/or rotation can vary from 0°-90°, with corresponding mathematical compensations required to produce the specimen image. The precision specimen scanning stage 18 is configured for positioning a specimen (not shown) relative to incident electron beam 14. A projector lens 24 (or a multiple of projector lenses) receives a transmitted electron beam 26 transmitted through at least part of the specimen and focuses transmitted beam 26 (conveying information relative to at least part of the specimen) onto an image plane 28. A detection system 30 is placed approximately in the image plane 28. Confocal scanning transmission electron microscope 10 further includes a control system 32.

Electron illumination device 12 can have an electron source 34 followed by a condenser lens 36 (or a multiple of condenser lenses) along propagation axis 16. Electron illumination device 12 can further include an electron beam limiting aperture and blanker 38 followed by an aberration corrector 40 along propagation axis 16. Aberration corrector 40 can correct for spherical aberration, and/or other first order and/or higher order aberrations, such as chromatic aberration. The aberration corrector 40 is optional and is used to improve the spatial resolution of the microscope; it is not strictly needed for a fully functional confocal STEM system. System 12 can include an objective lens 42 between aberration corrector 40 and precision specimen scanning stage 18. Aberration correctors may also be placed at other positions, for example, between the objective lens 42 and the detection system 44. The microscope may also include other electron optical elements, such as a monochromator, a phase plate, or a biprism.

In one embodiment, precision specimen scanning stage 18 is a high-speed precision XYZ stage as can be used for scanning probe microscopy (SPM) and contains a position read-out or indicator. A high-quality scanning stage is provided, for example, using piezo scanners as sold by the company Attocube (Germany), for example. This 3D scanner (model number ANSxyz100 for example) has a scan range of 40 μm×40 μm×24 μm, a mechanical noise better than 0.1 nm and a scan speed of 100 lines/s. For maneuvering of the sample over a larger range, the scan stage can be placed on a motor stage with a few millimeter travel range. A typical 3D image consists of 512 lines and 100 steps in Z-direction, giving 500 sec=8 min imaging time. The data acquisition in one line has to be synchronized with the scan motion, which is a standard procedure in SPM.

Detection system 30 is placed approximately in image plane 28 and can include an electron detector 44 and electron beam limiting device 46. Electron beam limiting device 46 can be a pinhole aperture, or other aperture such as a line aperture, a holographic beam limiting device, and adjustable aperture such as an iris, or other beam limiting elements. The detection system can include an annular dark field detector, or a bright field detector, or a position sensitive detector, such as a charge coupled device camera, or an energy resolved detector, such as an electron energy loss detector, or a combination of detectors. The detection system can include further electron optical elements, such as lenses, deflectors and apertures to direct electron trajectories into the detector or detectors.

Control system 32 includes overall process controller 48, microscope controller 50, beam blanker controller 52, stage controller 54, stage position read-out 56, and detector read-out 58. Microscope controller 50 can control various elements of electron microscope 10 such as electron source 34, and other elements of electron illumination device 12 and electron microscope 10. Beam blanker controller 52 controls electron beam limiting aperture and blanker 38 to divert the incident electron beam 14 from propagation axis 16 and objective lens 42 thus "blanking," i.e., diverting the incident electron beam 14 from the specimen on precision specimen scanning stage 18. Stage controller 54 controls the positioning and scanning of precision specimen scanning stage 18. Stage position read-out 56 provides the realtime (or nearly realtime) position coordinates of precision specimen scanning stage 18. Detector read-out 58 provides the realtime (or nearly realtime) detected signal from electron detector 44 to overall process controller 58, and is synchronized with stage controller 54 and read-out 56. Process controller 48 provides the overall control for microscope controller 50, beam blanker controller 52, and stage controller 54; using feedback from stage position read-out 56 and detector read-out 58.

The optical path is precisely adjusted with the settings of the electron source 34, the lenses 24, 36, 42, optical aberration corrector 40, and optional deflection and stigmator coils (not shown), to form a finely focused probe in the plane of the specimen and project this probe on the pinhole 46 and detector 44. All elements are controlled by the control system 32. Once set, the optical path does not have to be changed. Only optional fine adjustment might be needed to compensate for mechanical drift of the components.

Controller 48, microscope controller 50, beam blanker controller 52, stage controller 54, stage position read-out 56, and detector read-out 58 can be implemented in hardware, software or firmware. The hardware can include a variety of computing/controlling devices such as desktop or other computers, microprocessors, application specific integrated circuits, field programmable gate arrays, memory devices, etc. Further, control system 32 can include other elements or electronics such as preamplifiers/amplifiers, analog to digital (A/D) converters, D/A converters, signal processors, filters, and other elements.

In one embodiment, a 3D image of the specimen or sample is formed by the following sequence of events as controlled by process controller 48: 1) microscope 10 is set in the correct operating mode, 2) stage controller 54 drives stage 18 to a predetermined position, 3) the position of stage 18 is read-out via stage position read-out 56 and stored, 4) beam blanker 38 is opened to provide incident electron beam 14 at the specimen, 5) a scan sweep of stage 18 is provided to the x-motor (or other actuator) of stage 18, 6) a continuous signal is read-out by electron detector 44, digitalized and stored, and synchronously, the stage 18 position is read-out continuously, digitalized and stored, 7) the y position of stage 18 is changed to a new position, 8) steps 5-7 above are repeated for the desired field of view, 8) the z-position (propagation axis 16) of stage 18 is changed, 9) steps 5-8 are repeated for the full 3D imaging volume of the specimen, 10) beam blanker 38 is shut. The stage position can be adjusted during the imaging sequence to compensate for drift.

Figure 2A:
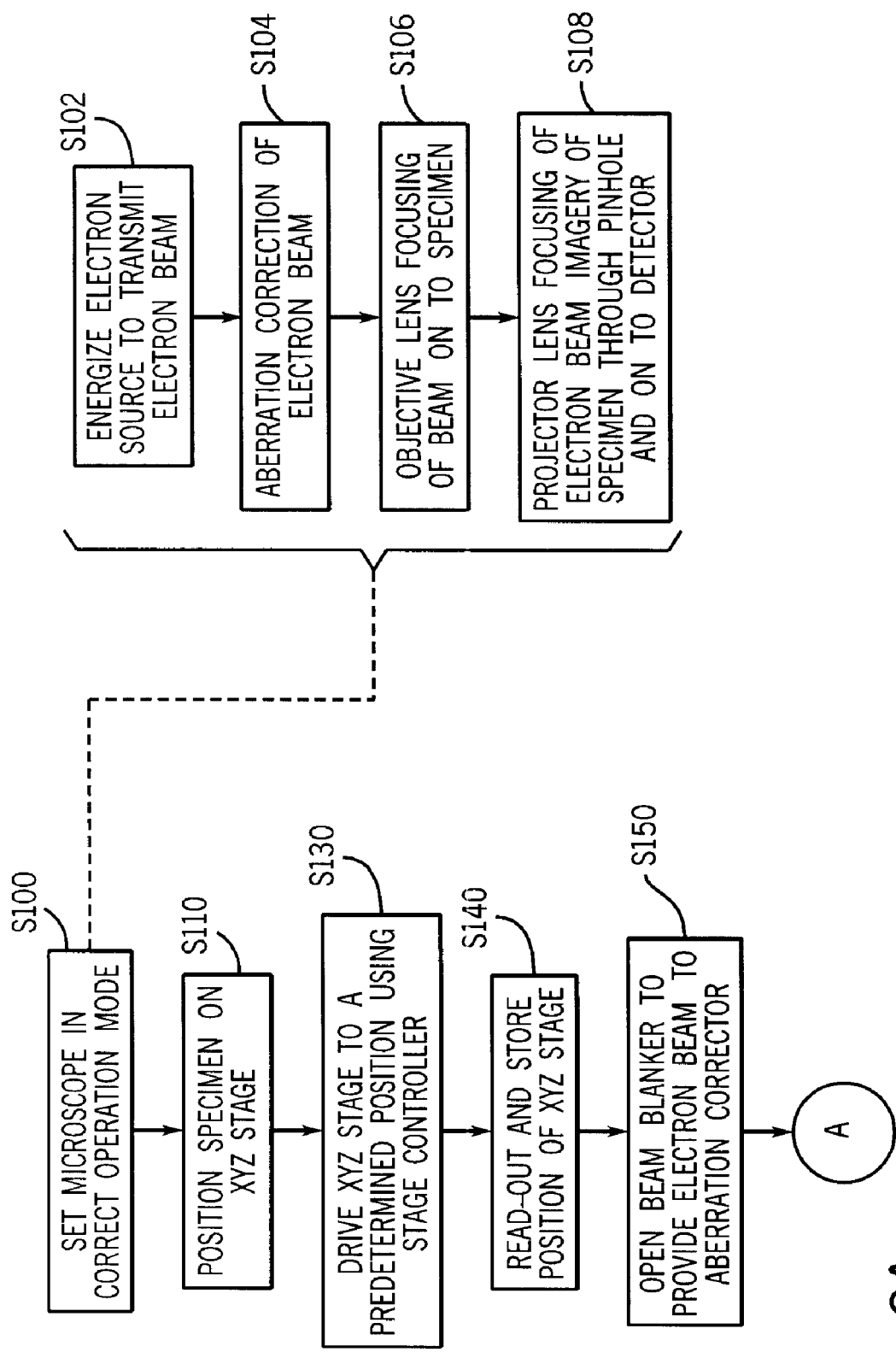
FIG. 2A is a flow chart of an embodiment of a method according to the present invention.
Figure 2B:
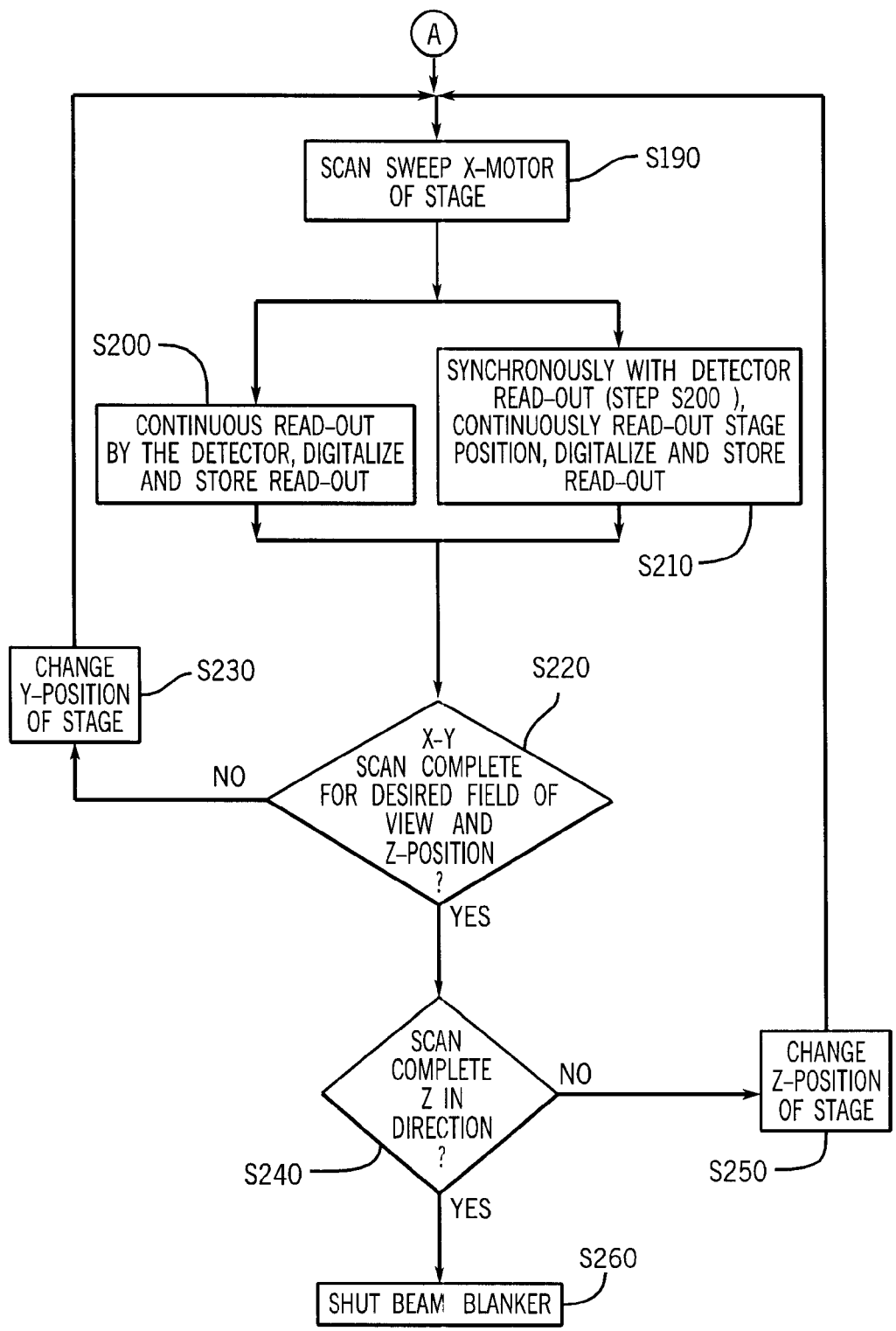
FIG. 2B is a continuation of the flow chart of FIG. 2A.

More specifically, and referring to FIGS. 2A and 2B, in step S100 microscope 10 is set in the correct operation mode. Step S100 includes a number of sub-steps. Electron illumination device 12, and particularly, electron source 34, are energized to transmit incident electron beam 14 in step S102. Adjusting the aberration correction of electron beam 14 occurs in step S104. Step S106 includes adjusting the objective lens 42 to focus the incident electron beam 14 onto the specimen. In step S108, the projector lens 24 is adjusted to focus the specimen through electron beam limiting device 46, which is shown as a pinhole aperture, and onto electron detector 44. Step S100 can also include different substeps, or a different order of the steps S102, S104, S106 and S108. Step S110 positions the specimen on precision specimen scanning stage 18. Step S130 drives stage 18 to a predetermined position using stage controller 54. This initial position of stage 18 is read-out and stored in step S140. Beam blanker 38 is opened to provide electron beam 14 to aberration corrector 40 in step S150. A scan sweep of stage 18 is performed in step S190, for example in the X-direction (see FIG. 1) of the X-motor (or other X-direction actuator) of stage 18. In step S200, a continuous read-out by electron detector 44 and detector read-out device 58 is performed, which read-out is digitalized and stored by control system 32. Synchronously with step S200, step S210 continuously reads-out the stage 18 position, which read-out is also digitalized and stored by control system 32.

Step S220 is a decision step where a determination is made if an X-Y scan is complete for desired field of view and a given Z-position: if the scan is not complete go to step S230 where the Y-position of stage 18 is changed and steps S190, S200, and S210 are repeated; if the scan is complete for desired field of view and a given Z-position then go to step S240. Step S240 is a decision step where a determination is made if the scan is complete in the Z direction (optical axis). If the scan is not complete in the Z direction then go to step S250 where the Z-position of stage 18 is changed and steps S190, S200, S210, S220, and S230 are repeated; if the scan is complete for desired field of view and a given Z-position then go to step S260. In step S260 beam blanker 38 is closed and the operation is essentially complete.

Figure 2C:
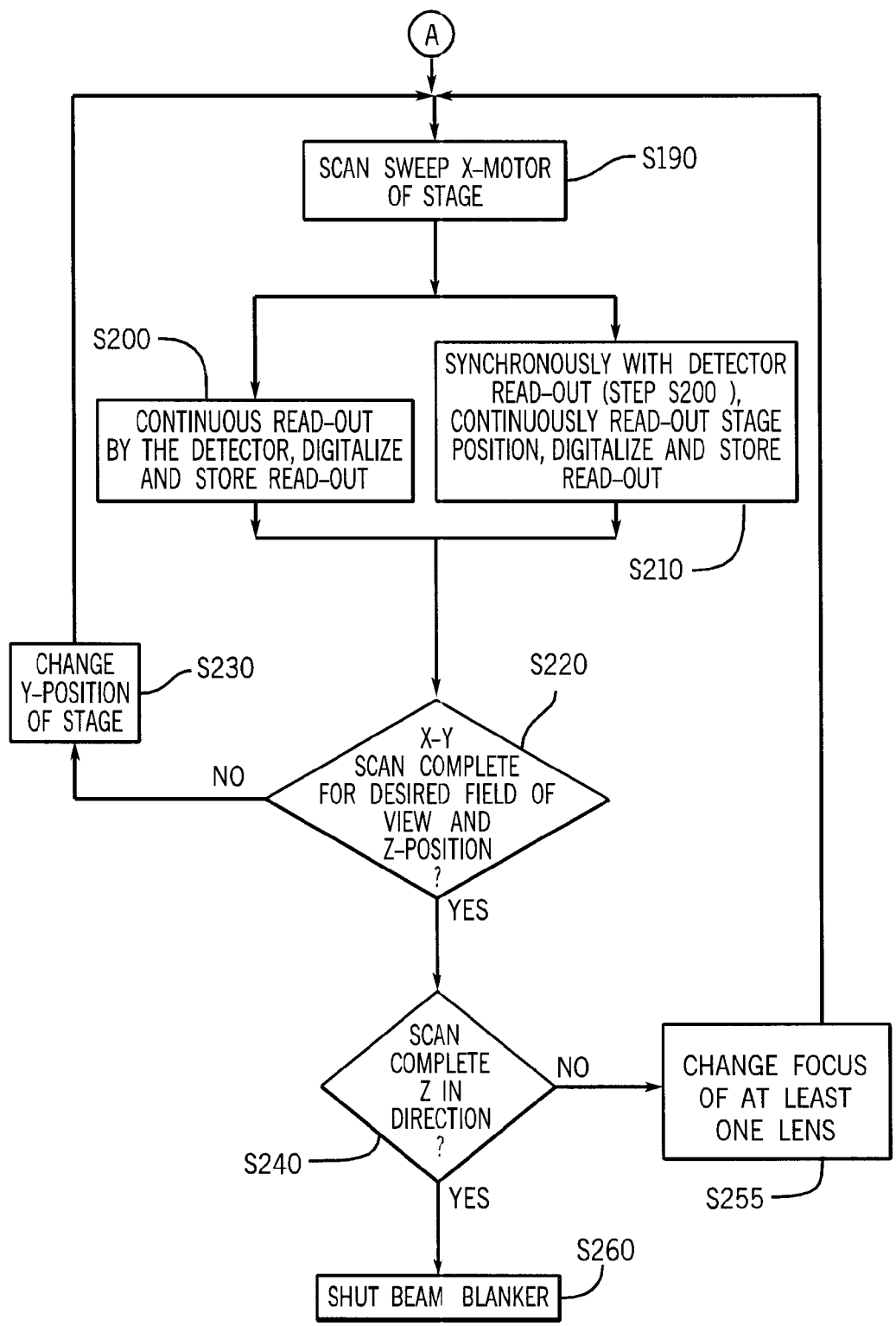
FIG. 2C is a flow chart similar to FIG. 2B illustrating an alternative embodiment to the steps of FIG. 2A which indicates a refocusing of a lens step instead of a change of Z-position of the stage.

In another form of the method, as depicted in FIG. 2C, step S250 is replaced by a step S255. In S255 the focus position of the objective lens 42 is changed by the microscope controller 50, such that the electron beam focuses at a different position along the propagation axis. The focus change of lens 42 can be accompanied with a change of the projector lens 24 by the microscope controller 50, such to project the focus position of 42 on the beam limiting device 46.

Figure 2D:
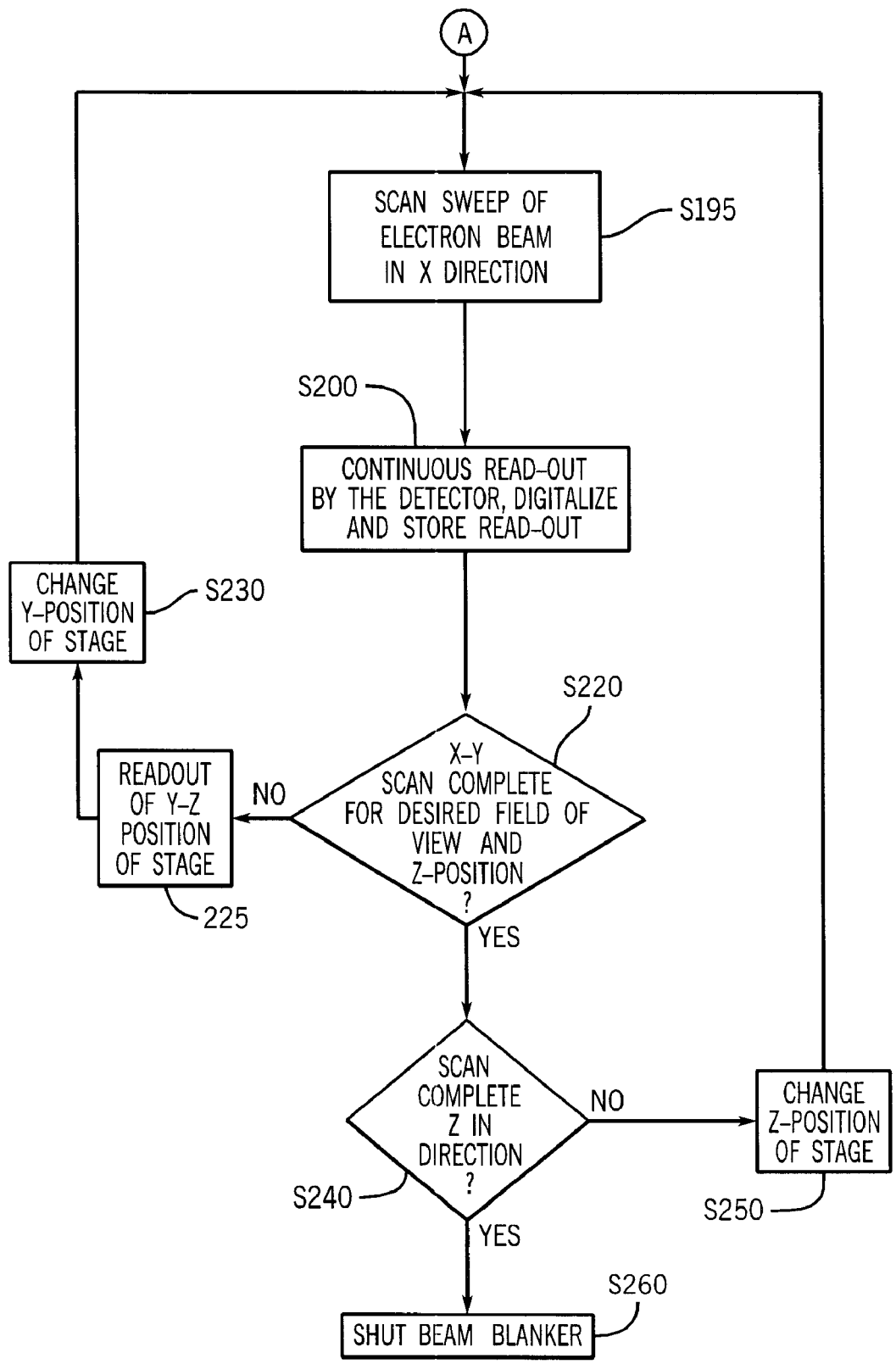
FIG. 2D is a flow chart continuation of FIG. 2A illustrating another embodiment which includes a slit aperature instead of a pin hole aperature, and scan coils to deflect the electron beam.
Figure 3:
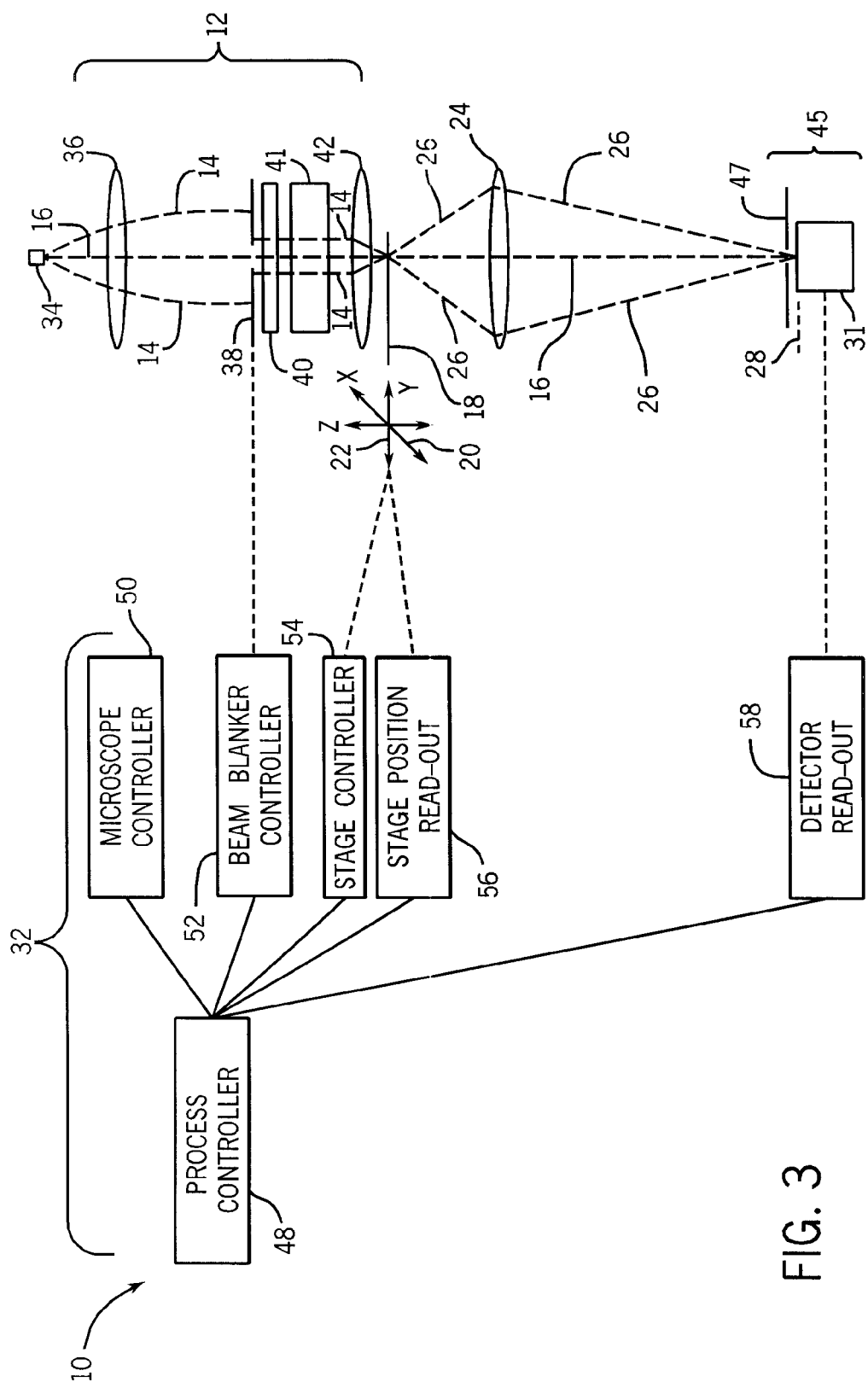
FIG. 3 is a schematic side view of another embodiment of a confocal scanning transmission electron microscope consistent with the method of FIG. 2D.

Referring to FIGS. 2D and 3, the invention comprises, in yet another form thereof, a confocal scanning transmission electron microscope 10 which includes an electron illumination device providing an incident electron beam propagating in a direction defining a propagation axis, and a precision specimen scanning stage 18 positioned along the propagation axis and movable in a y direction 22 perpendicular to the propagation axis 16. The precision specimen scanning stage is configured for positioning a specimen relative to the incident electron beam. A projector lens 24 receives a transmitted electron beam transmitted through at least part of the specimen and focuses this transmitted beam onto an image plane 28. The transmitted beam results from the specimen being illuminated by the incident electron beam. This embodiment is similar to FIG. 1 with the exception of elements 30, 44 and 46. In FIG. 3, a detection system 45 is placed approximately in the image plane 28, the detection system 45 including a slit aperture 47 oriented in a second direction substantially orthogonal with the y direction 22 and the electron beam propagation direction 16. The detection system 45 can include a line detector 31 including, for example, an array of detectors including one or more of the types as described in the above for the detector system 30, such as annular dark field detector, or position sensitive detector. Other types of detectors can be used as well, such as an array of electron multiplier channels embedded in, for example, a micro-channel plate, and a device to convert multiple of electron beams to light-signals, such as a phosphor screen, and a device to convert the more or less parallel light signals to electrical signals, such as a linear charge coupled device (CCD). The detector elements define an array of positions on a line, for example 512 points. The line detector contains elements to digitize and read-out all points and storing the information. An example of such a read-out device is a fast analog digital converter connected to a shift register and a computer. This embodiment further includes scan coils 41 to deflect the beam in x direction 20, or y direction 22.

In an embodiment of the method to acquire a high-resolution 3D image of a specimen using slit aperture 47 and the line detector 31, and referring to FIG. 2A, FIG. 2D, and FIG. 3C, instead of steps S190, step S195 occurs, which includes a scan sweep of an electron beam in the x direction 20. The line detector 31 defines an array of points. These points are read-out in step S200 prior to moving the stage in the y direction (step S230). In step S225, the Y-Z position of the stage is read-out.

As indicated by the de Broglie relation, electrons behave like waves whose wavelength depends on the voltage through which they have been accelerated (higher voltages producing more momentum in the electron and hence a shorter wavelength). Electrons which are accelerated through 100V-300,000V exhibit wavelengths in the range of 0.122 nm-0.0025 nm, which range is greater than a thousand times less than the wavelength of visible light. As the resolving power of a microscope depends on the wavelength of the electromagnetic energy used for detecting the sample, the present invention can provide a high-resolution three dimensional image of the specimen.

More specifically, the present invention provides a 3D electron microscope which has sub-nanometer resolution due to the use of an electron beam and an aperture, it also has single particle sensitivity and it can be applied to many different types of samples, common to an electron microscope. The present invention thus solves the problem of limited resolution of laser confocal microscopy and the need for crystals in X-ray crystallography and the limited use of NMR. The present invention provides better resolution than electron tomography and overcomes its problems related to its tilt-series. Since the optical path is kept constant in the present invention, the problem with synchronous scanning of prior-art confocal STEM is overcome. Additionally, the resolution of the present invention in the Z-direction is largely improved with respect to prior-art wide field STEM without a pinhole aperture. That is, the present invention has the further advantage that the image in one z-plane is not mixed with a strong out-of-focus signal from the adjacent planes, due in part to the presence of the aperture 46, or 47 in front of the electron detector 44, or 31.

One commercial application area is drug development in the pharmaceutical industry. In order to perform drug development, knowledge is needed of biological systems (cells, proteins, DNA, etc.) at a molecular level. High-resolution 3D techniques are of critical importance to gain this knowledge. For example, the company Side c Technologies AB, Sweden, offers 3D characterization of proteins for drug development. The apparatus and method according to the present invention can aid significantly in this field as a tool. For example, the National Institute of Health (NIH) has already expressed strong interest in the development of the wide field STEM without pinhole aperture, as was published for biological samples (N. de Jonge, et al., "3-Dimensional Aberration Corrected Scanning Transmission Electron Microscopy for Biology", in "Nanotechnology in Biology and Medicine", ed. Vo-Dinh, T., 2007 (CRC Press), pp 13.1-13.27).

State-of-the-art semiconductor industry requires high-resolution 3D imaging of silicon (or other material) wafers containing devices to test design principles and enhance yield. For example one electronic company uses many transmission electron microscopes routinely in the wafer factory. This company expressed strong interest in the wide field STEM without pinhole aperture and a joint publication was made (K. van Benthem, et al., Three-Dimensional Imaging of Individual Hafnium Atoms Inside a Semiconductor Device, Applied Physics Letters 87, 034104-1-3, 2005).

Other fields such as biology and materials science can utilize the high-resolution 3D information provided by the present invention.

While example embodiments and applications of the present invention have been illustrated and described, including a preferred embodiment, the invention is not limited to the precise configuration and resources described above. Various modifications, changes, and variations apparent to those skilled in the art may be made in the arrangement, operation, and details of the methods and systems of the present invention disclosed herein without departing from the scope of the claimed invention.

I claim:

1. A confocal scanning transmission electron microscope, comprising:
    an electron illumination device providing an incident electron beam propagating in a fixed direction defining a propagation axis;
    a specimen scanning stage positioned along the propagation axis and configured for movement in at least a first direction and in a second direction, wherein one of the first and second directions is parallel to, and one of the first and second directions is transverse to, the propagation axis, the specimen scanning stage also being configured for receiving the specimen at a specimen position to be scanned;
    a projector lens positioned for receiving the electron beam transmitted through at least part of the specimen position, the projector lens being arranged for focusing the transmitted beam onto an image plane, the transmitted beam resulting from the specimen position being illuminated by the electron beam;
    an electron beam limiting device positioned approximately in the image plane for transmitting in-focus illumination and rejecting out-of-focus illumination;
    a detector positioned after the electron beam limiting device with respect to the fixed direction, the detector detecting a signal originating from electrons of the electron beam;
    a stage position read-out and a detector read-out, for reading out data for an image having dimensions as small as one nanometer, and
    wherein a signal is read out from the detector read-out with a corresponding specimen position from the stage position read-out as the scanning stage is moved in at least the first direction and the second direction to collect data for a 3-dimensional image having dimensions as small as one nanometer.

2. The confocal scanning transmission electron microscope of claim 1, wherein the specimen scanning stage is also configured for movement in a third direction which is transverse to the fixed direction of propagation of the electron beam; and
    wherein the signal is read out from the detector read-out with a corresponding specimen position from the stage position read-out as the scanning stage is moved in the first direction and in the second direction and in the third direction to collect data for the 3-dimensional image.

3. The confocal scanning transmission electron microscope of claim 2, wherein the second direction is substantially along the propagation axis, and the first direction, the second direction and the third direction are all substantially orthogonal to each other.

4. The confocal scanning transmission electron microscope of claim 1, wherein the electron beam limiting aperture is closer to the detector than to the projector lens.

5. The confocal scanning transmission electron microscope of claim 4, wherein the electron beam limiting device is at least one of a pinhole aperture, a ring-shaped aperture and a slit opening.

6. The confocal scanning transmission electron microscope of claim 1, wherein the electron illumination device includes an electron source followed by a condenser lens along the propagation axis.

7. The confocal scanning transmission electron microscope of claim 6, wherein the electron illumination device further includes an electron beam limiting aperture and blanker followed by an aberration corrector along the propagation axis.

8. The confocal scanning transmission electron microscope of claim 7, wherein the electron illumination device further includes an objective lens between the aberration corrector and the precision specimen scanning stage.

9. The confocal scanning transmission electron microscope of claim 1, wherein the electron beam limiting device is a slit opening oriented in a second direction substantially orthogonal with the first direction.

10. The confocal scanning transmission electron microscope of claim 1, further including at least one scan coil to deflect the incident electron beam.

11. A method of generating a high-resolution three-dimensional image of a specimen using a confocal scanning transmission electron microscope, comprising the steps of:
    providing an incident electron beam propagating in a direction defining a propagation axis;
    positioning a specimen scanning stage along the propagation axis;
    positioning a specimen on the precision specimen scanning stage relative to the incident electron beam such that the incident electron beam is illuminating the specimen thereby producing a transmitted electron beam;
    imaging the transmitted electron beam with a projector lens onto an electron beam limiting device a detection system being placed approximately at a focal point of the transmitted beam, and positioning a detection system after the beam limiting device with respect to the direction of the electron beam propagation, the detection system having a detector; and
    reading an image signal from a detector read-out with a corresponding specimen position from a stage position read-out as the scanning stage is moved in at least the first direction and in the second direction transverse to the first direction to collect data for a 3-dimensional image having dimensions as small as at least one nanometer.

12. The method of claim 11, wherein the scanning stage is controlled with the detector to read out an image signal with a corresponding specimen position from the scanning stage as the scanning stage is moved in the first direction, the second direction and a third direction to collect image data for the 3-dimensional image.

13. The method of claim 12, further including the step of determining if a two dimensional scan is complete in the first direction and the second direction.

14. The method of claim 13, further including the step of determining if a three dimensional scan is complete including a direction along the propagation axis.

15. The method of claim 11, further including the step of correcting at least one aberration in the incident electron beam.

16. The method of claim 15, wherein the at least one aberration includes spherical aberration.

17. The method of claim 11, further comprising the steps of:
controlling a beam blanker along the propagation axis on which the incident electron beam impinges;
correcting at least one aberration in the incident electron beam after the incident electron beam passes through the beam blanker.

18. The method of claim 11, wherein the electron beam limiting device is a slit aperture.

19. The method of claim 11, further including the step of deflecting the incident electron beam with at least one scan coil.

20. A method of generating a high-resolution three-dimensional image of a specimen using a confocal scanning transmission electron microscope, comprising the steps of:
providing an electron illumination device having an incident electron beam propagating in a direction defining a propagation axis;
positioning a specimen scanning stage along the propagation axis;
positioning a specimen on the specimen scanning stage relative to the incident electron beam such that the incident electron beam is illuminating the specimen and producing a transmitted electron beam;
imaging the transmitted electron beam with a projector lens onto an electron beam limiting device being placed approximately at a focal point of the transmitted beam, and reading out a signal from a detector placed after the beam limiting device with respect to the beam propagation direction to collect data of the specimen;
scanning the specimen to a new position in a plane transverse to the propagation axis using the specimen scanning stage; and
further including the step of changing a focus of at least one lens of the confocal scanning transmission electron microscope between read-outs of image signals for the specimen.

21. The method of claim 20, wherein the changing step includes a substep of changing the focus at the specimen.

22. The method of claim 20, wherein the changing step includes a substep of changing a focus of an image.

* * * * *